(12) United States Patent
Sherer

(10) Patent No.: US 6,843,830 B2
(45) Date of Patent: Jan. 18, 2005

(54) ABATEMENT SYSTEM TARGETING A BY-PASS EFFLUENT STREAM OF A SEMICONDUCTOR PROCESS TOOL

(75) Inventor: John Michael Sherer, Gilbert, AZ (US)

(73) Assignee: Advanced Technology Materials, Inc., Danbury, CT (US)

(*) Notice: Subject to any disclaimer, the term of this patent is extended or adjusted under 35 U.S.C. 154(b) by 0 days.

(21) Appl. No.: 10/249,506

(22) Filed: Apr. 15, 2003

(65) Prior Publication Data

US 2004/0206237 A1 Oct. 21, 2004

(51) Int. Cl.$^7$ ............................................. B01D 53/04
(52) U.S. Cl. ........................ 95/90; 95/133; 96/135; 96/142; 423/210
(58) Field of Search ................. 95/90, 133; 96/108, 96/134, 135, 136, 142–144; 423/210, 248; 422/93, 273

(56) References Cited

U.S. PATENT DOCUMENTS

| | | | | |
|---|---|---|---|---|
| 3,812,653 A | * | 5/1974 | Massoth et al. | ............... 95/133 |
| 4,578,256 A | * | 3/1986 | Nishino et al. | ............. 423/210 |
| 4,861,939 A | * | 8/1989 | Debras et al. | ............... 585/820 |
| 5,089,244 A | * | 2/1992 | Parent et al. | ............... 423/347 |
| 5,460,636 A | * | 10/1995 | Harada et al. | ................. 96/244 |
| 5,785,741 A | * | 7/1998 | Li et al. | ........................... 96/4 |
| 5,858,065 A | * | 1/1999 | Li et al. | ........................ 95/45 |
| 6,068,685 A | * | 5/2000 | Lorimer et al. | ................ 96/112 |
| 6,093,236 A | * | 7/2000 | Klabunde et al. | ............. 95/128 |
| 6,277,173 B1 | * | 8/2001 | Sadakata et al. | ............... 95/12 |
| 6,491,884 B1 | * | 12/2002 | Faller et al. | ................. 423/210 |
| 2001/0008123 A1 | * | 7/2001 | Hayes et al. | .......... 118/723 CB |
| 2002/0023540 A1 | * | 2/2002 | Abe et al. | ...................... 96/134 |
| 2003/0094098 A1 | * | 5/2003 | Watanabe et al. | .............. 95/90 |
| 2003/0097929 A1 | * | 5/2003 | Watanabe et al. | .............. 95/90 |
| 2003/0138367 A1 | * | 7/2003 | Brady et al. | ................. 423/210 |

* cited by examiner

*Primary Examiner*—Robert H. Spitzer
(74) *Attorney, Agent, or Firm*—Margaret Chappuis; Steven Hultquist, Esq.

(57) ABSTRACT

An apparatus and method for abating toxic and/or hazardous gas species in a diluent gas stream line deriving from a by-pass line of a semiconductor process tool, comprising contacting the diluent gas stream with a dry resin sorbent material having an affinity for the toxic and/or hazardous gas species to effect the removal of at least a portion of the toxic and/or hazardous gas species by a chemisorbent or physisorbent reaction between the sorbent bed and the toxic gas component effectively reduces the concentration of the toxic gas component in the process diluent stream to below TLV.

24 Claims, 6 Drawing Sheets

ABATEMENT SYSTEM TARGETING A BY-PASS EFFLUENT STREAM OF A SEMICONDUCTOR PROCESS TOOL

BACKGROUND OF INVENTION

1. Background

Embodiments described relate to dry resin sorbent systems in a by-pass line of a semiconductor process tool useful for reducing toxic and/or hazardous gaseous components deriving therefrom.

2. Background of the Related Art

Typical and emerging semiconductor Epitaxial (EPI) processes use toxic and/or hazardous source gases such as arsine ($AsH_3$), phosphine ($PH_3$), germane ($GeH_4$) and diborane ($B_2H_6$) for deposition of hetero-epitaxial thin films. Many of these processes are equipped with point-of use (POU) water scrubbers, which are designed to abate specific gases used in such processes, such as dichlorosilane ($SiH_2Cl_2$). However, wet scrubbers are ineffective at abating many hydride gases such as $AsH_3$ and $PH_3$. If a point-of-use water scrubber is used, the unabated hydride gases may be released to the roof, where they can be further re-entrained into the semiconductor facility through make up air fans.

These toxic and/or hazardous gases are typically diluted with hydrogen when fed to EPI reactors, many of which continuously by-pass some of that gas to "equalize" pressure/flow to the reactor. By such design, during deposition, only a small amount of hydride gas flows to the reactor, while a much larger amount bypasses the chamber and goes directly to vent. The by-pass can go to outside air directly or to a POU abatement system on the EPI reactor.

Many EPI processes feed hydride gases in ppm levels and mass flow controllers are typically used to control their flow. The hydride gas may be used in combination with diluents and/or are combined therewith in a mixing manifold up-stream of a mass-flow controller. Pressure in the manifold is maintained at a constant level by pressure controllers, transducers etc.

It is plausible to use a thermal oxidizer in the bypass line to reduce the occurrence of hydride gas components being released to the environment or ventilation system. However, if the hydride gas component in the bypass line is, for example, arsine, arsenic-containing waste is generated, which must be handled and treated carefully as arsenic is highly toxic. Further, a high cost of ownership is associated with thermal oxidizers, particularly in the area of fuel consumption.

Alternatively a combination thermal/wet scrubber may be used in the bypass line to reduce the occurrence of hydride gas components being released to the environment or ventilation system. However, if arsenic is present in the by-pass line, arsenic-containing by-products will become entrained in the wastewater. The arsenic-contaminated water is highly controlled in certain areas of the United States and will likely require further treatment prior to disposal. Moreover, initial costs of such a system start in a six-digit dollar range and maintenance and operational costs are predicted to start in a five-digit dollar range.

Therefore, it is one objective of the present invention, to provide an inexpensive solution to controlling the release of hazardous and/or toxic gas components from a bypass line upstream of a semiconductor process tool.

It is a further objective of the present invention to provide an inexpensive solution to controlling the release of hazardous and/or toxic gas components from a point-of-use water scrubber.

SUMMARY OF INVENTION

Summary

The present invention provides a by-pass abatement system and process for removing pollutants from a by-pass effluent gaseous stream, which is preferably derived from a semiconductor process tool.

In one aspect, the present invention relates to an abatement apparatus and system for use in a by-pass process line originating from a semiconductor process.

In a further aspect, the invention relates to an abatement apparatus, comprising a sorbent-based scrubber, which when joined in fluid flow communication with an effluent gas stream comprising a hazardous component, reduces the concentration of the hazardous component in the effluent gas stream.

In a still further aspect, the present invention relates to a point-of-use scrubber for treating a toxic and/or hazardous component in an effluent waste stream deriving from a by-pass line of a semiconductor process tool, said scrubber comprising a canister having: an inlet in gas flow communication with the process tool's bypass line; an outlet; and a sorbent bed therebetween; wherein said sorbent bed contacts the toxic and/or hazardous component in the effluent waste stream to effectively reduce the concentration therein of the toxic and/or hazardous component.

In a still further aspect, the present invention relates to an abatement apparatus for reducing the concentration of a toxic and/or hazardous component, in a by-pass line of an epitaxial deposition reactor, the apparatus comprising an up-flow canister.

In a further aspect, the present invention relates to a point-of-use scrubber for treating an effluent waste stream comprising a toxic and/or hazardous component, said waste stream deriving from a by-pass line of a semiconductor process, said scrubber comprising: an up-flow canister comprising: a lower section plenum space: an upper section plenum space; at least one dry resin sorbent bed layer therebetween; an inlet in gas flow communication with the by-pass process line; and an outlet, arranged such that the process effluent waste stream flows in an upward direction to effectively reduce the concentration of the toxic and/or hazardous component from the effluent waste stream.

In a further aspect the present invention, relates to a process for reducing the concentration of a toxic and/or hazardous component in a diluent waste stream deriving from a by-pass line of semiconductor process tool, said process comprising, contacting the diluent gas stream with a dry resin sorbent material having an affinity for the toxic and/or hazardous component, to effect the removal of at least a portion of the toxic and/or hazardous component by a chemisorbent or physisorbent reaction between the sorbent material and the toxic gas component in the process diluent waste stream to below TLV.

BRIEF DESCRIPTION OF DRAWINGS

Brief Description of the Drawings

Figure 1:
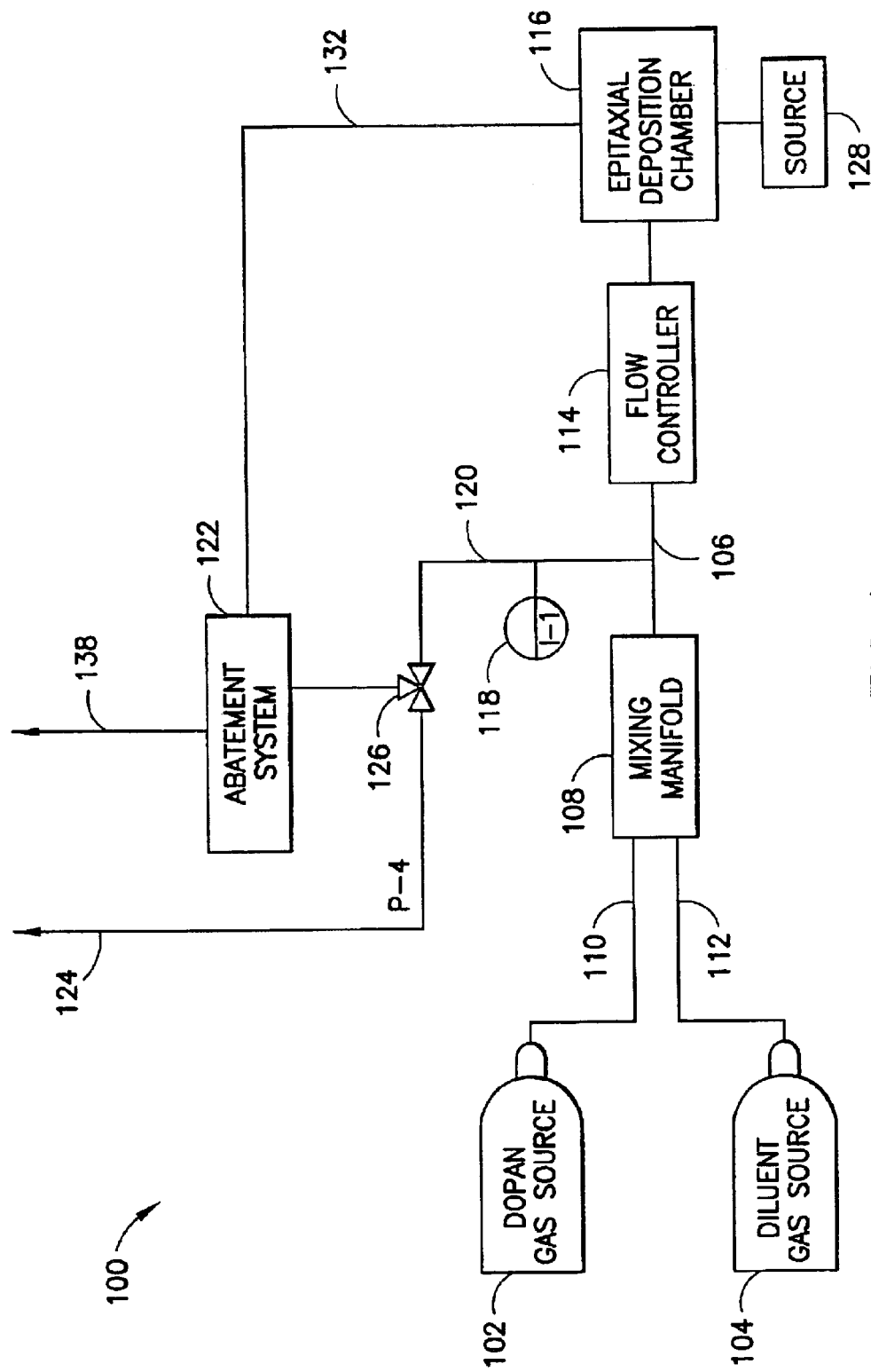

FIG. 1 shows a schematic representation of a typical epitaxial deposition system according to one embodiment of the present invention.

Figure 2:
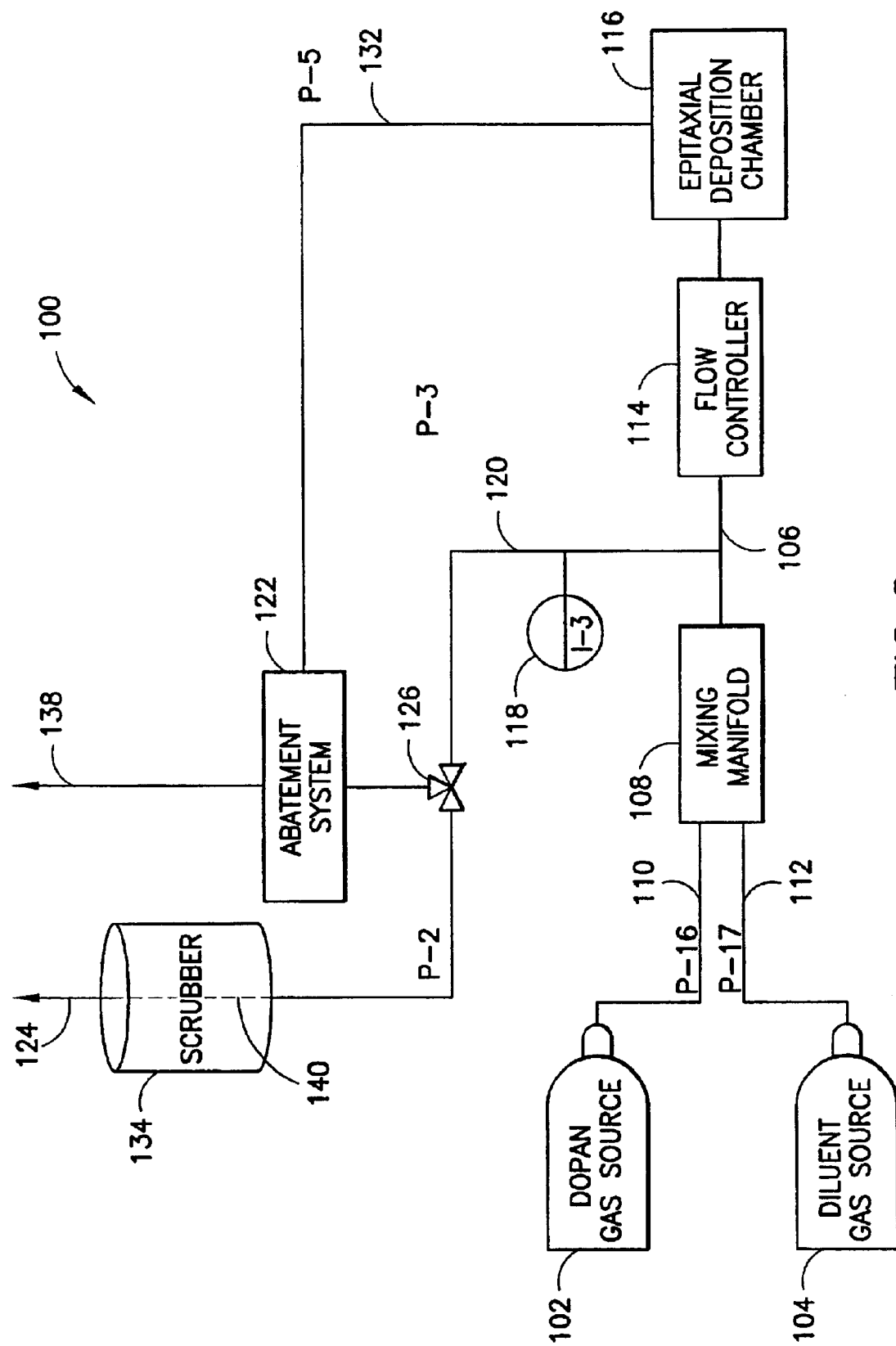

FIG. 2 shows a schematic representation of a by-pass abatement system according to one embodiment of the present invention.

Figure 3:
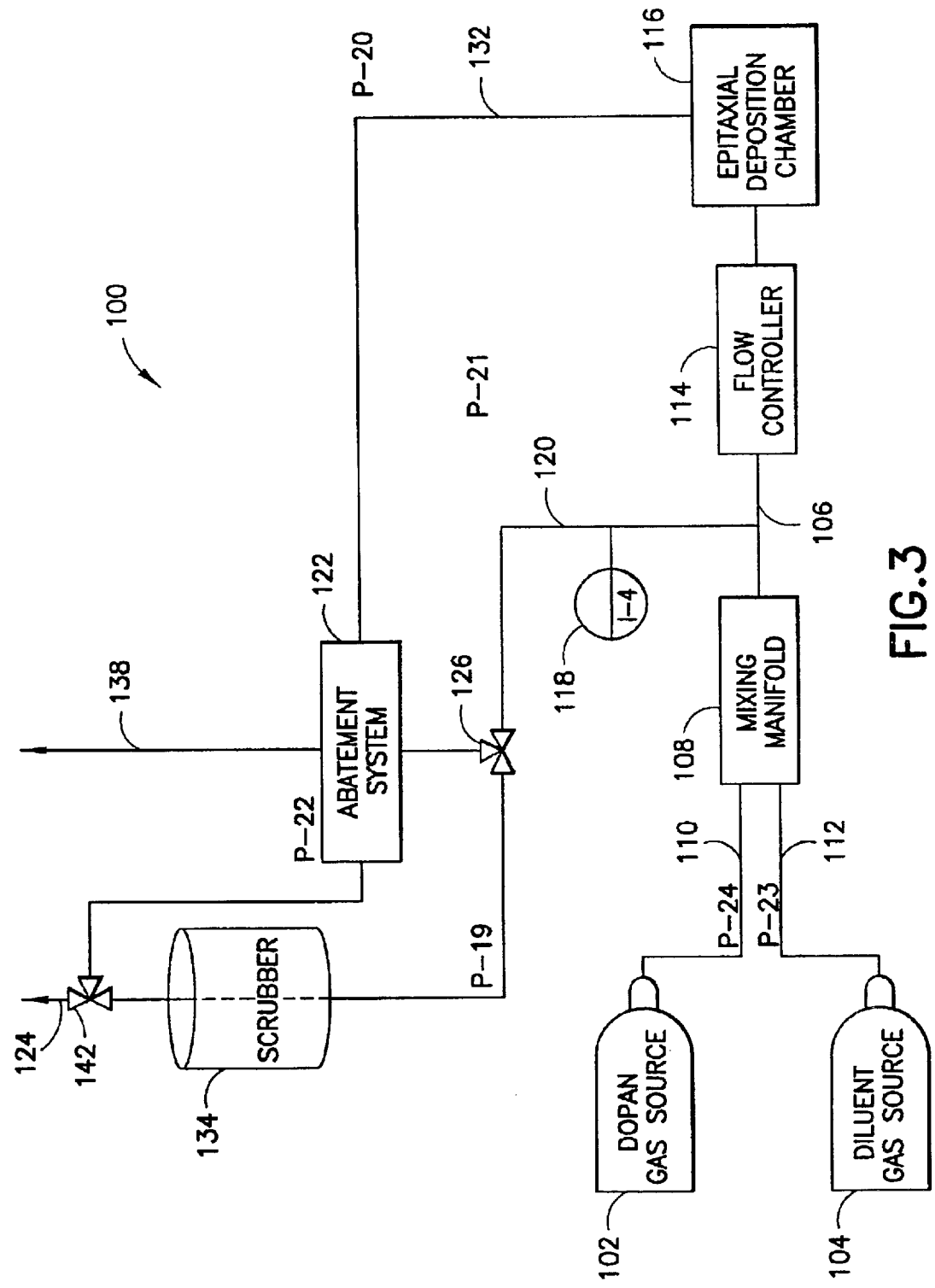

FIG. 3 shows a schematic representation of a bypass abatement system according to a further embodiment of the instant invention.

Figure 4:
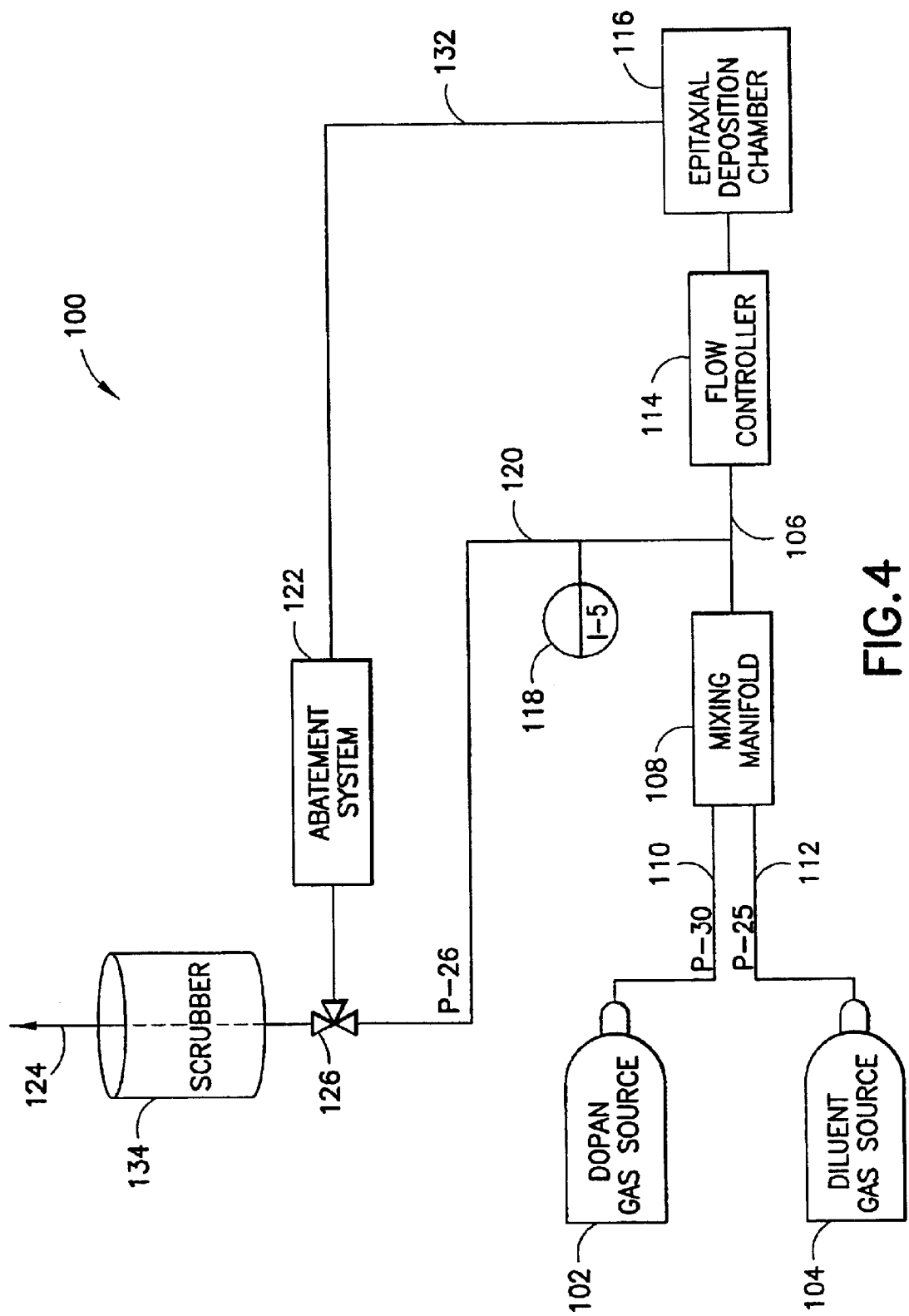

FIG. 4 shows a schematic representation of a bypass abatement system according to a further embodiment of the instant invention.

Figure 5:
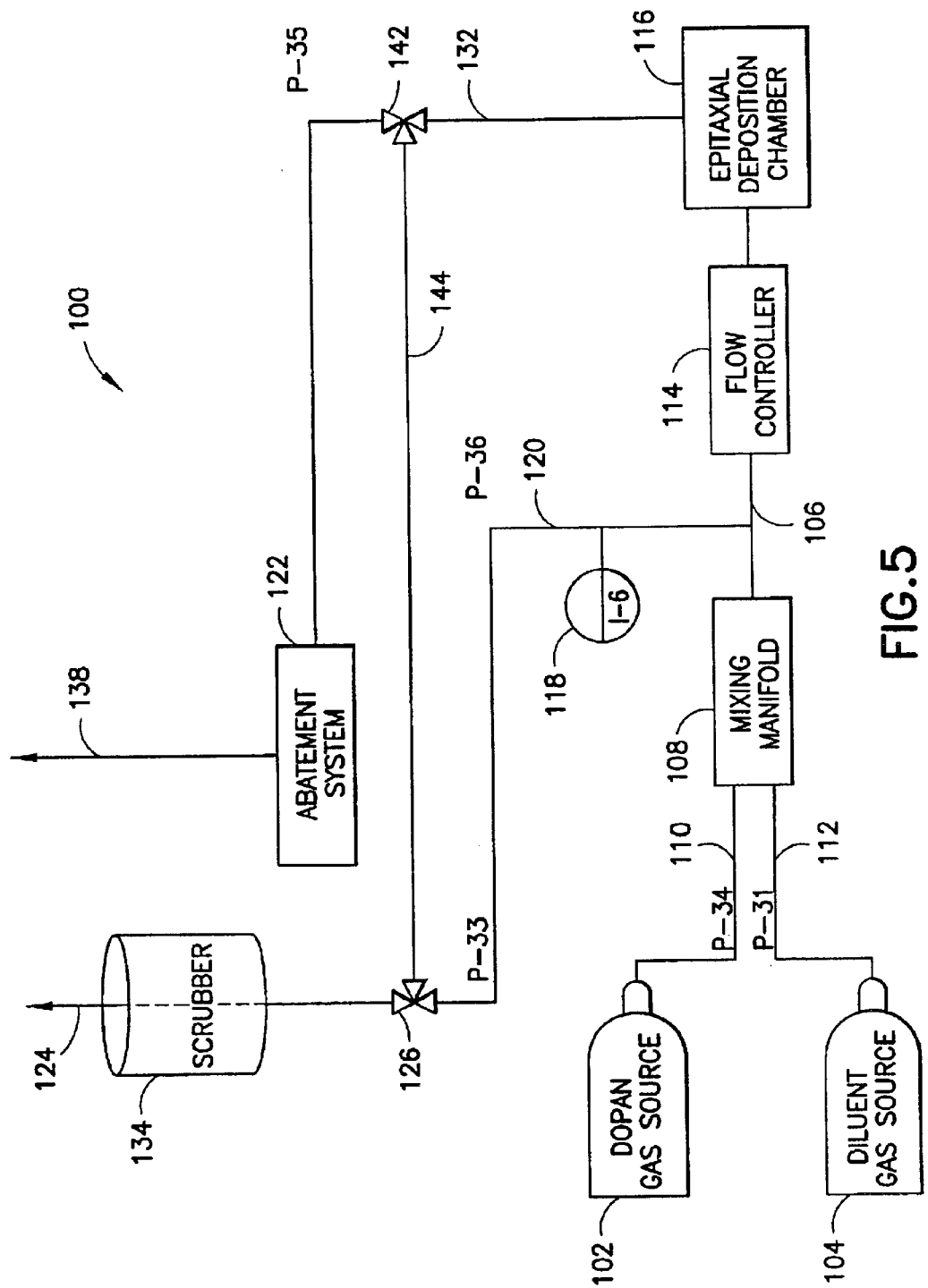

FIG. 5 shows a schematic representation of a bypass abatement system according to a further embodiment of the instant invention.

Figure 6:
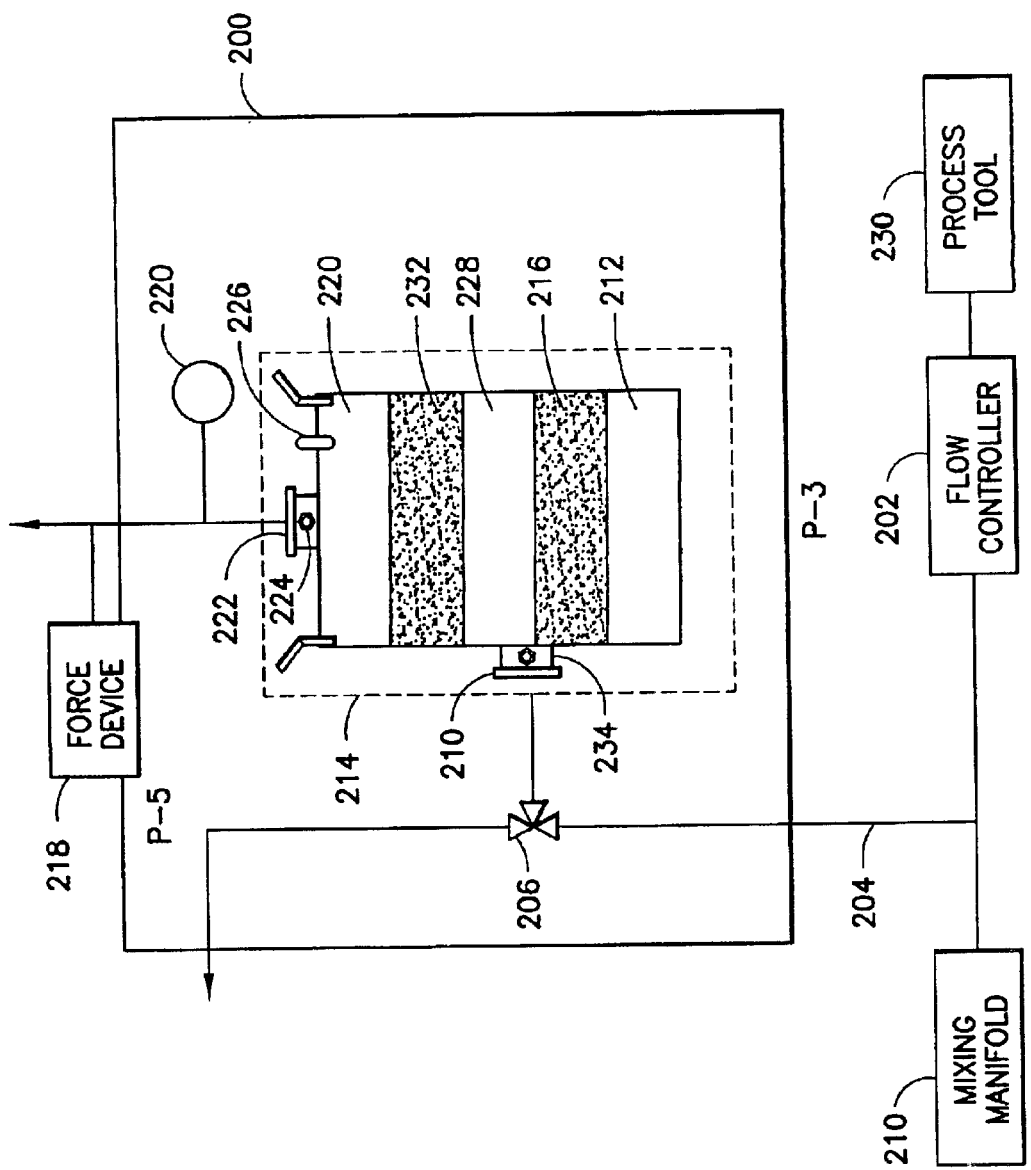

FIG. 6 shows a schematic representation of a bypass abatement system according to a further embodiment of the instant invention.

DETAILED DESCRIPTION

Detailed Description

The present invention provides a by-pass abatement system and process for removing pollutants from a by-pass effluent gaseous stream, which is preferably derived from a semiconductor process tool.

The invention comprises a scrubber in a by-pass line of a semiconductor process tool, where prior to such invention, a toxic gas component having been diluted by a diluent gas had been by-passed from the process tool for discharge to atmosphere, house-exhaust or other disposition steps.

The scrubber accommodates the collection of toxic and/or hazardous gas components in a diluent by-pass stream, typically considered pollutants, by contacting the diluent gas stream with a sorbent bed material, which may be fixed or fluidized and may work by physical adsorption or irreversible chemisorption.

Preferably the sorbent bed comprises a dry resin sorbent material arranged in a canister, such that by-pass effluent enters a headspace (plenum space) above or below the bed prior to contact with the sorbent material. In order to provide headspace below the bed, a support may be inserted into the canister to support the sorbent bed. Preferably effluent enters the canister at a cross-sectional center at a bed inlet (the cross-section being transverse to the flow direction of the gas stream being flowed through the bed).

The canister having any shape or size useful for treating a by-pass effluent stream comprising a toxic and/or hazardous component, provides for flow of the by-pass effluent stream into the canister and through the sorbent bed in either an upward or a downward direction, in a vertically upstanding canister. In a preferred embodiment, the canister is of an up-flow design having a cylindrical or cubic geometry and a volume that is between 0.1 to 1000 liters. In a more preferred embodiment, the canister volume is between 4 and 50 liters.

The cubic container may be adapted to minimize volumetric space requirements in storage, transport and use. In one specific embodiment, the abatement system includes a cubic up-flow canister having at least upper and lower plenum spaces and a sorbent bed section therebetween.

As used herein the terms "cube and "cubic" are interchangeable and are defined as having three dimensions and six faces, where the angle between any two adjacent faces is a right angle.

The up-flow canister as used herein is more fully described in co-pending, commonly assigned, U.S. patent application Ser. No. 10/370,159 having a filing date of Feb. 19, 2003, for Low Pressure Drop Canister for Fixed Bed Scrubber Applications and Method of Using Same, in the names of Paul J. Marganski, Theodore A. Shreve, Joseph Sweeney, Jose Arno, Mark Holst, and Karl Olander, and is incorporated herein by reference in its entirety.

The up-flow canister design counteracts any flow distribution problems that otherwise may occur in the flow of gas through the sorbent bed. Preferably, the up-flow canister comprises: a lower section plenum space; a center section space, for containment of a sorbent bed material; an upper section plenum space; an inlet in gas flow communication with the semiconductor process effluent stream, comprising means for introducing the process effluent stream to the lower section plenum space; and an outlet comprising means for egress of the process effluent stream from the canister.

The lower section plenum space, upper section plenum space and sorbent bed section, may each occupy any percent of the interior section of the canister and may be readily determined by one skilled in the art. Variables affecting the volume occupied by each of the three sections include but are not limited to process, volumes of toxic component to be abated, resin choice, effluent fluid flow, canister shape, inlet design etc.

As used herein, the by-pass abatement system and process are intended to be broadly construed, and may alternatively comprise, consist, or consist essentially of the specific stated components hereafter specifically identified. Although exemplary embodiments describe particular aspects, any changes, modifications, and substitutions may be made without departing from the spirit and scope of these embodiments.

In some prior art systems, diluent mass flow controller vented to the POU water scrubber, during deposition, which was typically ineffective in trapping and abating the toxic hydride component.

The canister of the abatement system may couple to a semiconductor process tool in a by-pass line in upstream or downstream relationship to a house or other POU scrubber system or the canister may couple to the by-pass line as a stand-alone abatement system dedicated to the abatement of toxic and/or hazardous component in the by-pass line. In a preferred embodiment, the by-pass abatement system employing a dry resin sorbent bed in an up-flow or down-flow canister, is either stand-alone or upstream of a house or POU abatement system and serves to prevent the release to atmosphere or house-exhaust, of toxic and/or hazardous gaseous components in a process effluent stream, not trapped by the primary abatement system.

Preferably, the by-pass abatement system targets a diluent mass flow controller (MFC) in a process gas manifold, having incorporated therein, a bypass line for exhaust of excess process diluent gas from the process manifold. The by-pass line may be coupled to a POU or house abatement system, atmosphere, vent or a roof of a semiconductor facility.

When the excess process diluent gas contains toxic gas components, and the by-pass line of the gas manifold exhausts the excess process diluent to atmosphere, vent or a roof of a semiconductor facility, the potential is present, for the toxic gas component to enter the environment or depending on environmental conditions, for the exhausted process gases to become entrained in the air up-take system.

Furthermore, when the excess process diluent stream contains a toxic gas component such as arsine, phosphine, germane, etc., a point-of-use or house abatement system does not sufficiently control the release of the toxic component to atmosphere, a vent or a roof of a semiconductor facility.

In typical EPI process tools, a mixing manifold upstream of the tool is used to combine diluent and doping gas, for example hydrogen and arsine respectively. Dopant gas typically flows to the mixing manifold through a first mass flow controller at rates of between 0–300 sccm and diluent typically flows through a second and separate mass flow controller at rates between 0–30 SLM. Between 80 to 99% of the resulting diluent hydride stream is by-passed from the system. Accordingly, in a preferred embodiment, the abatement system of the instant invention targets a by-pass line in the mixing manifold, upstream of the mixing manifold mass flow controller of an EPI process tool.

In a further embodiment, the abatement apparatus of the present invention, comprises an up-flow canister, housing a sorbent bed material comprising at least one metal oxide and more preferably a mixture of at least two metal oxides.

Advantageously, the instant invention provides an inexpensive solution to the release of unabated toxic gas component from an EPI process, by targeting the diluent flow rather than the total exhaust gas flow. The inexpensive benefits of the by-pass abatement system include but are not limited to its zero foot-print requirements and low maintenance requirements, as the system, may be mounted above a process tool in exhaust duct work, has no moving parts and generates only small amounts of toxic waste for disposal. Additionally, there are no adverse conditions occurring in the EPI process due to the operation of such a system.

The incorporation of an abatement system, using a dry resin sorbent bed, having an affinity for toxic gas components such as arsine, phosphine, germane, etc., into the by-pass line of a process manifold, controls the release of the toxic gas components to atmosphere, vent or the roof of a semiconductor facility. Advantageously, the instant invention controls the exhaustion of toxic and/or hazardous gaseous components, originating from a by-pass line of a diluent gas manifold of a semiconductor process.

FIG. 1 shows a typical Prior Art epitaxial deposition system and process 100, comprising dopant gas source 102 and diluent gas source 104 coupled to process line 106 through mixing manifold 108. A dopant hydride gas component such as $PH_3$, $AsH_3$, $GeH_4$, etc. and diluent gas such as hydrogen, flow to mixing manifold 108, in a predetermined ratio, through source delivery line 110 and diluent delivery line 112, where the dopant and diluent gases mix to form a diluent process effluent. Mass flow controller 114, downstream of mixing manifold 108, controls the flow of diluent process effluent to epitaxial deposition chamber 116. When, pressure controller 118, in the mixing manifold, exceeds a predetermined pressure, excess diluent process effluent flows into bypass line 120, through vent valve 126, to either atmosphere 124, or a point-of-use wet scrubber system or other house abatement system 122 and then to atmosphere 124. Effluent waste stream from epitaxial deposition chamber 116 flows through line 132 to point-of-use wet scrubber unit 122 useful for abating process acid gases such as HCl, $SIH_2Cl_2$ and $SiHCl_3$, originating from source 128. When process conditions include toxic and/or hazardous hydride gases originating from manifold 108, the toxic hydride gas component enters the atmosphere unabated, from both deposition chamber 116 and bypass line 120 by way of vents 124 and 138 respectively.

FIGS. 2–5 show the epitaxial deposition system of FIG. 1, having installed therein a by-pass scrubber according to further embodiments of the present invention. In describing such embodiments, with respect to FIGS. 2–5, like numerals will be used in accordance with FIG. 1 to identify similar features.

FIG. 2 depicts an epitaxial deposition system employing a point-of-use by-pass scrubber 134 coupled to bypass line 120. In such a system, mass flow controller 114, downstream of mixing manifold 108, controls the flow of diluent process effluent to epitaxial deposition chamber 116. When, pressure controller 118, in the mixing manifold, exceeds a predetermined pressure, excess diluent process effluent comprising a toxic gas component, flows into bypass line 120, through vent valve 126, to by-pass, up-flow canister 134, where a sorbent bed material, housed therein, contacts a toxic gas component, and a chemisorbent or physisorbent reaction between the sorbent bed material and the toxic gas component effectively reduces the concentration of the toxic gas component in the process diluent steam 140 to below TLV. Accordingly, an effluent waste stream having a reduced concentration of toxic gas component is exhausted from scrubber 134, to environment, or for further disposition in exhaust line 124.

FIG. 3 depicts a system where excess diluent process effluent comprising toxic gas component, flows into bypass line 120, through vent valve 126, to by-pass, up-flow canister 134, where a sorbent bed material, housed therein, contacts the toxic gas component and reacts to chemisorb or physisorb thereon at least a portion of the toxic gas component originating from the diluent mass flow controller 114. A resulting effluent stream having a reduced concentration of at least one toxic gas component exits canister 134 and flows through valve 142 to point-of-use abatement system (for example wet scrubber) 122, for further treatment and disposition 138.

FIG. 4 depicts a system where process fluid comprising a toxic gas component is exhausted from epitaxial deposition reactor 116, into process exhaust line 132 to point-of-use scrubber system 122, where a wet or thermal reaction effects the removal of at least a portion of the toxic gas component. The resulting effluent waste stream is exhausted from system 122 in effluent waste stream line 138 through valve 126 and into up-flow canister 134 where a chemisorbent or physisorbent reaction between a sorbent bed housed therein, and the toxic gas component in the effluent waste stream effectively reduces the concentration of at least one toxic component unabated by the main scrubber system 122. Accordingly, such a system provides for a polisher for scrubbing an effluent waste stream after a main or house abatement system has failed to remove at least a portion of toxic gas component from the effluent waste stream, said polisher comprising an up-flow canister having disposed therein a dry resin sorbent bed.

FIG. 5 depicts a system similar to that described hereinabove for FIG. 2, except for further inclusion of epi-reactor by-pass line 144, which provides for an alternative scrubber system for effluent waste stream deriving from reactor 116. Such a system provides for switchover from a main abatement system 122 to a by-pass scrubber system 134, by way of valves 142 and 126. Such a system enables switchover from a main scrubber 122, to a by-pass system 134, for more efficient effluent treatment as well as a back up in the event the main abatement system is taken off-line.

The dry-resin sorbent, abatement system of the instant invention, is useful for removing up to 99% of diluted hydride gas component in a bypass line of an epitaxial deposition process tool, and when the dry resin sorbent system is placed downstream of a point-of-use wet scrubber, which serves as a main abatement system for a particular semiconductor process tool, the instant invention, aids in the removal of toxic gas component unabated by the wet abatement system. Thus the instant invention obviates the potential release of hazardous and toxic gas components to a ventilation system and/or to the environment.

In a further embodiment, the present invention is directed to a process for reducing the concentration of at least one toxic and/or hazardous component in an effluent waste stream deriving from a by-pass line of a semiconductor process tool, comprising contacting the toxic and/or hazardous component with a dry resin sorbent material that is reactive with the toxic and/or hazardous component to substantially reduce the concentration of the toxic and/or hazardous component in the effluent stream. Preferably the toxic and or hazardous component is a hydride gas and the hydride gas component reacts with the dry resin sorbent material by chemisorption and/or physisorption to reduce the concentration in the effluent stream, of the hydride gas component.

By targeting the diluent mass flow controller, EPI process gases, such as, $SiH_2Cl_2$ and $SiHCl_3$, which are effectively controlled using wet and thermal oxidation systems pass to a thermal, wet or other point-of-use abatement system for treatment, while the diluent process line comprising from 80–99% of diluted hydride dopant gases for discharge from the system upstream of the process tool, has coupled thereto, an abatement system, comprising a dry resin sorbent bed, for controlling the release of toxic and hazardous hydride gases in a bypass line that are sent to a point-of-use or house scrubber system comprising a wet abatement system having little to no affect at scrubbing hydride dopant gases.

FIG. 6 shows a bypass abatement system 200, according to one embodiment of the present invention. Diluent process effluent stream comprising a toxic gas component, originating from mixing manifold 210, upstream from mass flow controller 202 and process tool 230, flows in bypass line 204, through valve 206, and inlet 210, into lower section plenum space 212 of canister 214, where the effluent stream mixes and expands, until the process effluent is mass transported into a first sorbent bed section 216, in an up-flow direction, by a pressure differential induced by fluid motive force device, such as an eductor or venturi 218. The toxic gas component contacts sorbent material 216, and the sorbent material, having an affinity for the toxic gas component retains thereon and/or reacts therewith, by chemisorption or physisorption at least a portion of the toxic gas component, in an evenly distributed manner, thereby creating a uniform fluid front or mass transfer zone (MTZ), which theoretically transfers evenly through the sorbent bed material.

The effluent stream having a reduced concentration of toxic gas component exits the sorbent bed section 216 and flows into an optional second plenum space 228, where the effluent stream, again mixes and expands, until the process effluent is mass transported into an optional second sorbent bed section 232, in an up-flow direction, by the pressure differential induced by the fluid motive force device 218. Toxic gas component not chemisorbed or physisorbed by first sorbent bed section 216, contacts sorbent bed section 232 and second sorbent bed section 232, retains thereon and/or reacts therewith, by chemisorption or physisorption, at least a second portion of toxic gas component, in an evenly distributed manner.

The effluent stream having a reduced concentration of toxic gas component, exits second sorbent bed section where it again mixes and expands until exhaustion through outlet port 222 where the effluent stream passes to environment, further treatment or other disposition steps.

Canister 214 may employ gas flow distributor elements (not shown) to effect a central efflux of gas for distribution across the entire cross-section of the container, to provide uniform flow without occurrence of hydrodynamic anomalies, such as dead space, bypassing, etc.

Various ancillaries are usefully employed with the scrubber system as described hereinabove including but not limited to end point monitoring, pressure and temperature sensing. Such ancillaries be linked in signal transmission relationship with a computer or other automatic process control means, for enabling automation responsiveness to various system parameters.

Referring again to FIG. 6, an end point monitor 224, such as a toxic gas sensor, may be coupled to an output module for outputting an indication of breakthrough of the contaminant(s) in the effluent gas stream when the capacity of the scrubber bed for active processing of the effluent gas stream is exhausted or reaches a predetermined approach to exhaustion (e.g., reaches a point of exhaustion of 95% of the total capacity of the dry scrubber material).

Optionally, a pressure sensing device 234 and/or 220, to monitor the pressure at the canister inlet and/or outlet respectively, may be coupled to an output module for outputting an indication of pressure for increasing or decreasing the energy input on the downstream fluid motive force device or to signal a blockage in the sorbent bed or scrubber inlet.

A thermal monitoring device 226, may be coupled to an output module for outputting an indication of temperature within the canister and sorbent bed(s). In this respect, a number of thermal monitoring devices, e.g., thermocouples, temperature probes, pyroelectric devices, etc., may be employed along the length of the bed in the direction of gas flow therethrough.

Advantageously, the instant invention provides an inexpensive solution to the potential release of toxic hydride gases to a semiconductor facility and/or environment. The inexpensive benefits of the system are in part due to the small footprint of the system and in further part due to the low maintenance required for such a system as there are no moving parts and only small amounts of toxic waste are generated for disposal. Additionally, there are no adverse conditions occurring at the CVD process due to the operation of such a system.

In a specific illustrative embodiment, a dry scrubber container may be employed, utilizing an up-flow design and operation, with centered up-flow of gas at the bed inlet. Additionally, a heat exchange coil in the bed arranged for maintaining bed temperature at a desired temperature level.

The sorbent material used in the up-flow canister of the present invention may react with contaminants in an effluent stream (adsorbate) by physical or chemical adsorption kinetics. Physical adsorption is due to intermolecular forces between an adsorbent and adsorbate (e.g. van der Waals interactions) and thus is reversible. Chemical adsorption involves a chemical reaction between the adsorbent and the adsorbate. Preferably the up-flow canister of the present invention utilizes a dry scrubbing medium having a chemisorption relationship with process contaminants. Various options are usefully employed with the scrubber system as described hereinabove including but not limited to end point monitoring, pressure and temperature sensing.

The system of the instant invention, preferably utilizes a dry resin sorbent material for trapping by chemisorption or physisorption reaction toxic gas components in a by-pass diluent waste stream. The dry resin sorbent material may comprise any combination of resins useful for scrubbing process gases specific to the particular process tool requiring effluent abatement and may be readily determined by those of skill in the art. Sorbent bed materials include but are not limited to: carbon, $CuSO_4$, $Cu(OH)_2$, $CuO$, $CuCO_3$, $CuCO_3Cu(OH)_2$, $Cu_2O$, $MnO_x$, wherein x is from 1 to 2 inclusive, $AgO$, $Ag_2O$, $CoO$, $Co_3O_4$, $Cr_2O_3$, $CrO_3$, $MoO_2$, $MoO_3$, $TiO_2$, NiO, LiOH, $Ca(OH)_2$, CaO, NaOH, KOH, $Fe_2O_3$, ZnO, $Al_2O_3$, $K_2CO_3$, $KHCO_3$, $Na_2CO_3$, $NaHCO_3$, $NH_3OH$, $Sr(OH)_2$, HCOONa, BaOH, $KMnO_4$, $SiO_2$, ZnO, MgO, $Mg(OH)_2$, $Na_2O_3S_2$, $SiO_2$, triethylenediamine (TEDA) and mixtures thereof. Preferably, the dry resin sorbent material of the instant invention comprises at least one of $CuSO_4$, $Cu(OH_2)$, CuO, $CuCO_3$, $CuCO_3Cu(OH)_2$, $Cu_2O$, $MnO_x$, wherein x is from 1 to 2 inclusive, $Ca(OH)_2$, and CaO.

Additionally, the sorbent material may further comprise a stabilizer or the active component may be impregnated into or coated onto an adsorbent substrate. Stabilizing materials help in the manufacturing of the sorbent media (e.g. in extrusion), and in some situations serves to prevent the sorbent media from decomposing. Useful stabilizers include but are not limited to the elements Be, Mg, transition metals selected from V, Mo, Co, Ni, Cu, Zn, B, Al, Si, Pb, Sb, Bi and oxides, hydroxides, hydrogen carbonates, hydrogen sulfates, hydrogen phosphates, sulfides, peroxides, halides, carboxylates, and oxy acids thereof.

The instant invention as it relates to a by-pass abatement system and associated process for removing toxic and/or hazardous hydride gas components from a process effluent waste stream deriving from a by-pass line of a mixing manifold of an Epitaxial deposition process tool, in one embodiment comprises an up-flow or down-flow canister housing therein a dry resin sorbent bed material comprising a metal oxide. The metal oxide sorbent material having an affinity for metal hydrides reacts therewith to substantially remove the hydride species from the effluent waste stream, until the capacity of the dry scrubber material for hydride species is at least partially exhausted.

To at least partially regain the capacity of the dry resin sorbent material for the hydride species, the instant invention may further comprise means to contact the at least partially exhausted capacity dry resin sorbent material with an oxidant effective to regenerate the dry scrubber material subsequent to diminution of hydride removal capacity thereof, as more fully described in U.S. patent application Ser. No. 09/717,439, filed Nov. 21, 2000, now issued as U.S. Pat. No. 6,491,884 the disclosure of which, is hereby incorporated herein in its entirety. The oxidant may be joined in oxidant supply relationship to the bed of dry resin sorbent material such that flow circuitry is arranged to flow oxidant in contact with the bed of sorbent material. Preferably, the flow circuitry is arranged to repetitively and alternatingly flow a diluent gas hydride-containing waste effluent stream followed by oxidation regeneration of the sorbent bed material.

Accordingly, while the invention has been described herein with reference to specific features and illustrative embodiments, it will be recognized that the utility of the invention is not thus limited, but rather extends to and encompasses other features, modifications and alternative embodiments as will readily suggest themselves to those of ordinary skill in the art based on the disclosure and illustrative teachings herein. The claims that follow are therefore to be construed and interpreted as including all such features, modifications and alternative embodiments within their spirit and scope.

What is claimed is:

1. A process for reducing the concentration of a toxic and/or hazardous component in a diluent waste stream deriving from a by-pass line of a semiconductor process tool, said process comprising, contacting the diluent gas stream with a dry resin sorbent material having an affinity for the toxic and/or hazardous component, to effect the removal of at least a portion of the toxic and/or hazardous component by a chemisorbent or physisorbent reaction between the sorbent material and the toxic gas component in the process diluent waste stream to below TLV, wherein said semiconductor process tool is in gas flow communication with an abatement system distinct from said dry resin sorbent material, for treatment for semiconductor process tool effluent produced by said semiconductor process tool.

2. A point-of-use scrubber for treating a toxic and/or hazardous component in an effluent waste stream deriving from a by-pass line of a semiconductor process tool, said scrubber comprising a canister having:
   an inlet in gas flow communication with the process tool's by-pass line;
   an outlet; and
   a sorbent bed therebetween;
   wherein said sorbent bed contacts the toxic and/or hazardous component in the effluent waste stream to effectively reduce the concentration therein of the toxic and/or hazardous component, and wherein said semiconductor process tool is in gas flow communication with an abatement system distinct from said point-of-use scrubber, for treatment of semiconductor process tool effluent produced by said semiconductor process tool.

3. The scrubber of claim 2, wherein said canister is of an up-flow design.

4. The scrubber of claim 3, wherein said up-flow canister further comprises at least a lower plenum space section and an upper plenum space section.

5. The scrubber of claim 4, wherein said sorbent bed resides in a section that is between said lower and upper plenum space sections.

6. The scrubber of claim 4, wherein said lower plenum space section is in gas flow communication with said canister inlet.

7. The scrubber of claim 4, wherein said upper plenum space is in gas flow communication with said canister outlet.

8. The scrubber of claim 2, wherein said canister is of a cubic geometry.

9. The scrubber of claim 2, wherein said canister has a volume that is between 0.1 to 1000 liters.

10. The scrubber of claim 2, wherein said canister has a volume that is between 4 and 50 liters.

11. The scrubber of claim 2, having a zero footprint.

12. The scrubber of claim 2, wherein said canister is of an up-flow design and of a cubic geometry.

13. The scrubber of claim 2, wherein said by-pass line comprises a mass flow controller.

14. The scrubber of claim 13, wherein said mass flow controller is upstream of said semiconductor process tool.

15. The scrubber of claim 2, wherein said by-pass line is coupled to at least one of: a point-of-use house abatement system comprising said abatement system distinct from said point-of-use scrubber, atmosphere, a vent and a roof of a semiconductor facility.

16. The scrubber of claim 2, wherein said toxic and/or hazardous component is selected from the group consisting of arsine, phosphine and germane.

17. The scrubber of claim 2, wherein said effluent waste stream further comprises a diluent gas.

18. The scrubber of claim 2, wherein said sorbent bed is of a dry resin material.

19. The scrubber of claim 18, wherein said dry resin material comprises at least one metal oxide.

20. The scrubber of claim 18, wherein said dry resin material comprises at least one component selected from the group consisting of: carbon, $CuSO_4$, $Cu(OH_2)$, CuO, $CuCO_3$, $CuCO_3.Cu(OH)_2$, $Cu_2O$, $MnO_x$, wherein x is from 1 to 2 inclusive, AgO, $Ag_2O$, CoO, $Co_3O_4$, $Cr_2O_3$, $CrO_3$, $MoO_2$, $MoO_3$, $TiO_2$, NiO, LiOH, $Ca(OH)_2$, CaO, NaOH, KOH, $Fe_2O_3$, ZnO, $Al_2O_3$, $K_2CO_3$, $KHCO_3$, $Na_2CO_3$, $NaHCO_3$, $NH_3OH$, $Sr(OH)_2$, HCOONa, BaOH, $KMnO_4$, $SiO_2$, ZnO, MgO, $Mg(OH)_2$, $Na_2O_3S_2$, $SiO_2$, triethylenediamine (TEDA) and mixtures thereof.

21. The scrubber of claim 18, wherein said dry resin material comprises at least one component selected from the group consisting of: $CuSO_4$, $Cu(OH_2)$, CuO, $CuCO_3$, $CuCO_3.Cu(OH)_2$, $Cu_2O$, $MnO_x$, wherein x is from 1 to 2 inclusive, $Ca(OH)_2$, and CaO.

22. The scrubber of claim 2, further comprising at least one of: an end point monitor, a pressure sensor and a temperature sensor.

23. An abatement apparatus for reducing the concentration of a toxic and/or hazardous component, in a by-pass line of an epitaxial deposition reactor, the apparatus comprising an up-flow canister containing material for reducing the concentration of a toxic and/or hazardous component, wherein said epitaxial deposition reactor is in gas flow communication with an abatement system distinct from said up-flow canister containing said material, for treatment of epitaxial deposition reactor effluent produced by said epitaxial deposition reactor.

24. A point-of-use scrubber for treating an effluent waste stream comprising a toxic and/or hazardous component, said waste stream deriving from a by-pass line of a semiconductor process, said scrubber comprising:

an up-flow canister comprising:

lower section plenum space;

an upper section plenum space;

at least one dry resin sorbent bed layer therebetween;

an inlet in gas flow communication with the by-pass process line; and an outlet, arranged such that the process effluent waste stream flows in an upward direction to effectively reduce the concentration of the toxic/and or hazardous component from the effluent waste stream, wherein said semiconductor process is in gas flow communication with an abatement system distinct from said point-of-use scrubber, for treatment of semiconductor process effluent produced by said semiconductor process.

* * * * *